US008835931B2

United States Patent
Wirth

(10) Patent No.: US 8,835,931 B2
(45) Date of Patent: Sep. 16, 2014

(54) OPTOELECTRONIC COMPONENT AND METHOD FOR PRODUCING AN OPTOELECTRONIC COMPONENT

(75) Inventor: Ralph Wirth, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/641,650

(22) PCT Filed: Mar. 18, 2011

(86) PCT No.: PCT/EP2011/054106
§ 371 (c)(1),
(2), (4) Date: Oct. 16, 2012

(87) PCT Pub. No.: WO2011/128173
PCT Pub. Date: Oct. 20, 2011

(65) Prior Publication Data
US 2013/0032820 A1 Feb. 7, 2013

(30) Foreign Application Priority Data

Apr. 16, 2010 (DE) .................. 10 2010 027 875

(51) Int. Cl.
| H01L 33/32 | (2010.01) |
| H01L 25/075 | (2006.01) |
| H01L 33/44 | (2010.01) |
| H01L 33/58 | (2010.01) |
| H01L 33/60 | (2010.01) |
| H01L 33/50 | (2010.01) |

(52) U.S. Cl.
CPC .............. *H01L 25/0753* (2013.01); *H01L 33/44* (2013.01); *H01L 33/58* (2013.01); *H01L 33/60* (2013.01); *H01L 2933/0091* (2013.01); *H01L 33/50* (2013.01)

USPC ................... 257/76; 438/34; 438/29; 438/35; 438/26; 438/27

(58) Field of Classification Search
USPC ........... 257/76, E33.027, 81, E31.108, 98, 80
See application file for complete search history.

(56) References Cited

U.S. PATENT DOCUMENTS

| 6,967,420 B2 | 11/2005 | Laurent et al. |
| 7,250,702 B2 | 7/2007 | Abou Akar et al. |
| 2004/0217364 A1 | 11/2004 | Tarsa et al. |
| 2006/0197098 A1 | 9/2006 | Aihara |

(Continued)

FOREIGN PATENT DOCUMENTS

| DE | 10 2007 058703 | 3/2009 |
| JP | 2000-150969 | 5/2000 |

(Continued)

*Primary Examiner* — Chuong A Luu
*Assistant Examiner* — Rodolfo Fortich
(74) *Attorney, Agent, or Firm* — Cozen O'Connor

(57) ABSTRACT

An optoelectronic component for mixing electromagnetic radiation having different wavelengths, more particularly in the far field. A first semiconductor chip for emitting electromagnetic radiation in a first spectral range is provided on a carrier. Furthermore, at least one a second semiconductor chip for emitting electromagnetic radiation in a second spectral range is provided on the carrier. The first and second spectral ranges differ from one another. The first semiconductor chip and the second semiconductor chip are arranged in a single package. The first semiconductor chip is optically isolated from the second semiconductor chip by a barrier. The first semiconductor chip and the second semiconductor chip are arranged centosymmetrically about a common center o(Z) of symmetry.

16 Claims, 13 Drawing Sheets

(56) References Cited

U.S. PATENT DOCUMENTS

| | | | |
|---|---|---|---|
| 2007/0001188 A1 | 1/2007 | Lee | |
| 2007/0228392 A1* | 10/2007 | Plank et al. | 257/79 |
| 2007/0274080 A1 | 11/2007 | Negley et al. | |
| 2008/0259598 A1* | 10/2008 | Sumitani et al. | 362/231 |
| 2008/0308822 A1 | 12/2008 | Tsang et al. | |
| 2009/0001393 A1 | 1/2009 | Seo et al. | |
| 2009/0108271 A1 | 4/2009 | Chou et al. | |
| 2009/0152571 A1 | 6/2009 | Su et al. | |
| 2009/0284951 A1 | 11/2009 | Muschaweck | |
| 2010/0117103 A1* | 5/2010 | Marfeld et al. | 257/91 |

FOREIGN PATENT DOCUMENTS

| | | |
|---|---|---|
| JP | 2001-351404 | 12/2001 |
| JP | 2003-008074 | 1/2003 |
| JP | 2005-123484 | 5/2005 |
| JP | 2005-158958 | 6/2005 |
| JP | 2007-019096 | 1/2007 |
| JP | 2007-112134 | 5/2007 |
| JP | 2007-201448 | 8/2007 |
| JP | 2007-281472 | 10/2007 |
| JP | 2007-534374 | 11/2007 |
| JP | 2007-324608 | 12/2007 |
| JP | 2008-027898 | 2/2008 |
| JP | 2008-041699 | 2/2008 |
| JP | 2008-263235 | 10/2008 |
| JP | 2009-038161 | 2/2009 |
| JP | 2009-060069 | 3/2009 |
| JP | 2009-277751 | 11/2009 |
| JP | 2010-190859 | 9/2010 |
| JP | 05-021458 | 9/2012 |
| WO | WO 2009-069671 | 6/2009 |

* cited by examiner

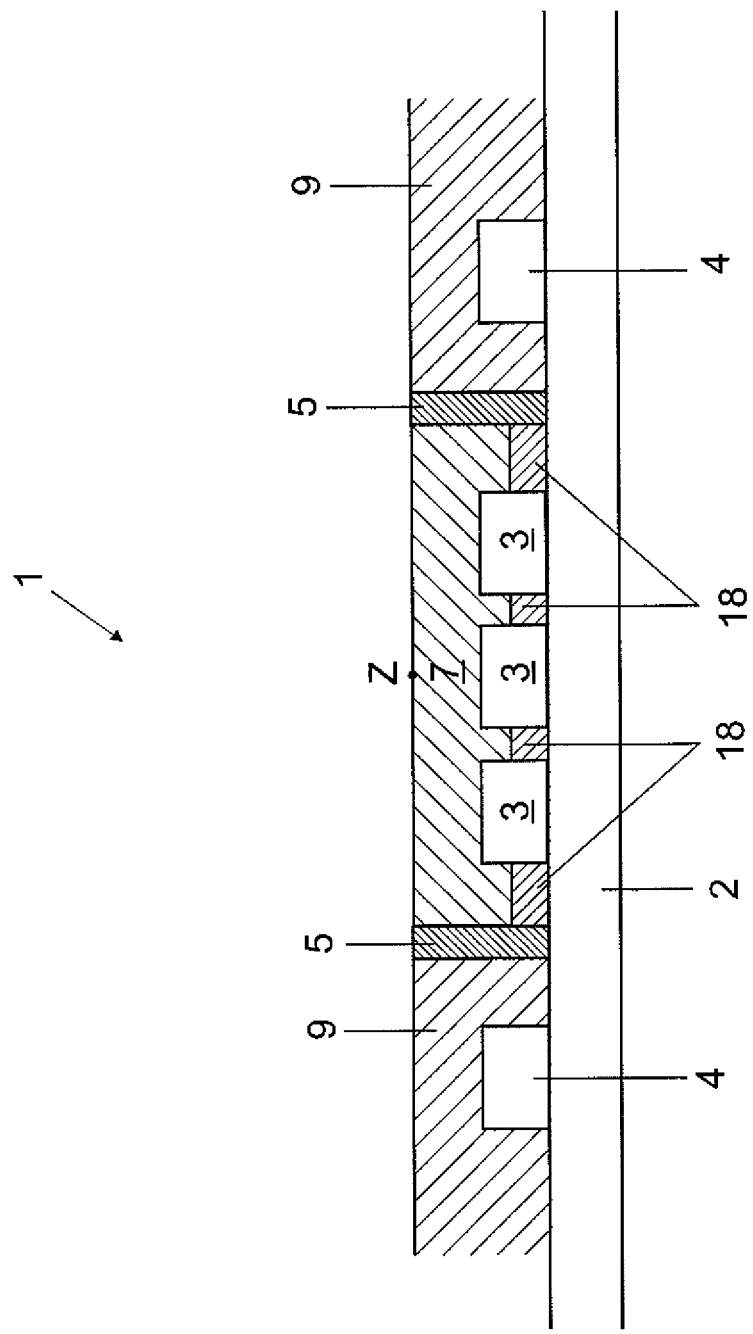

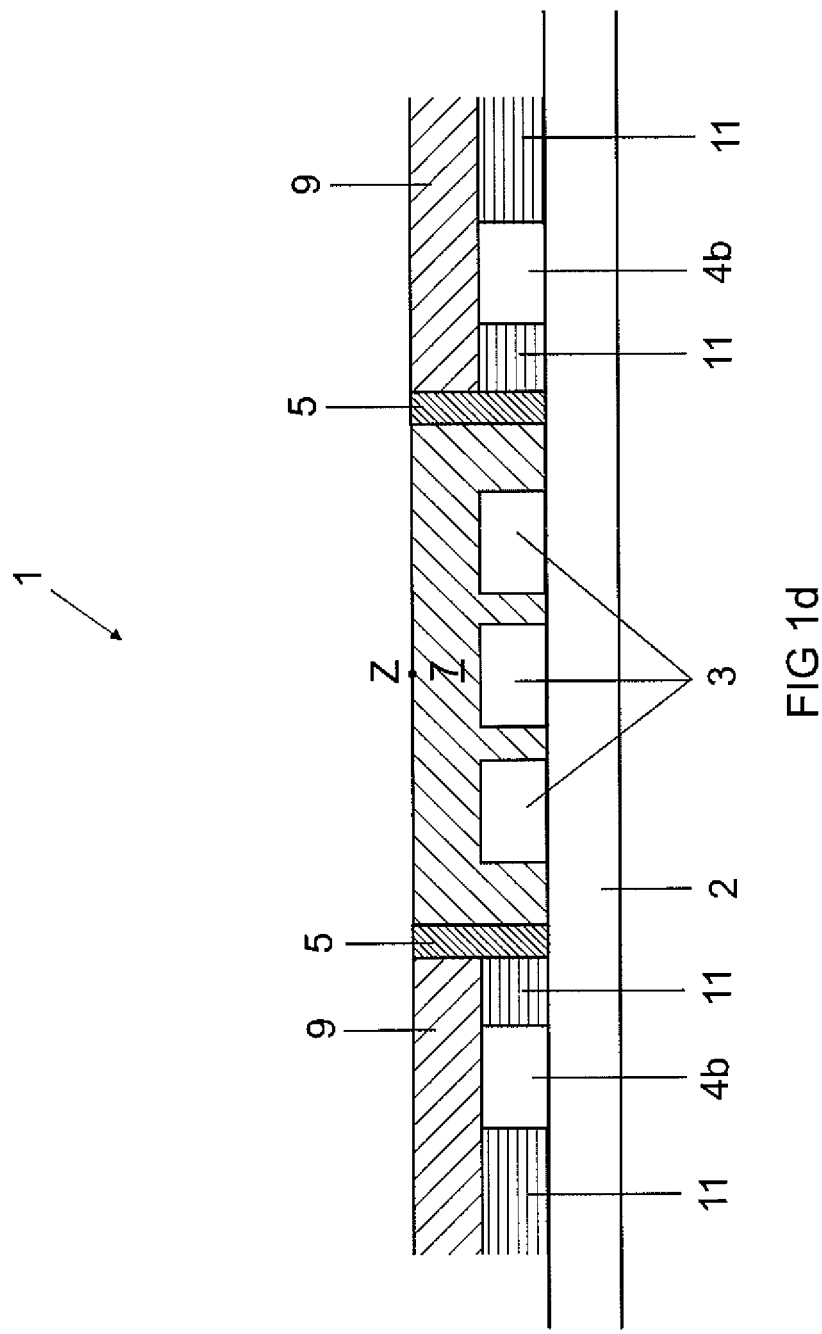

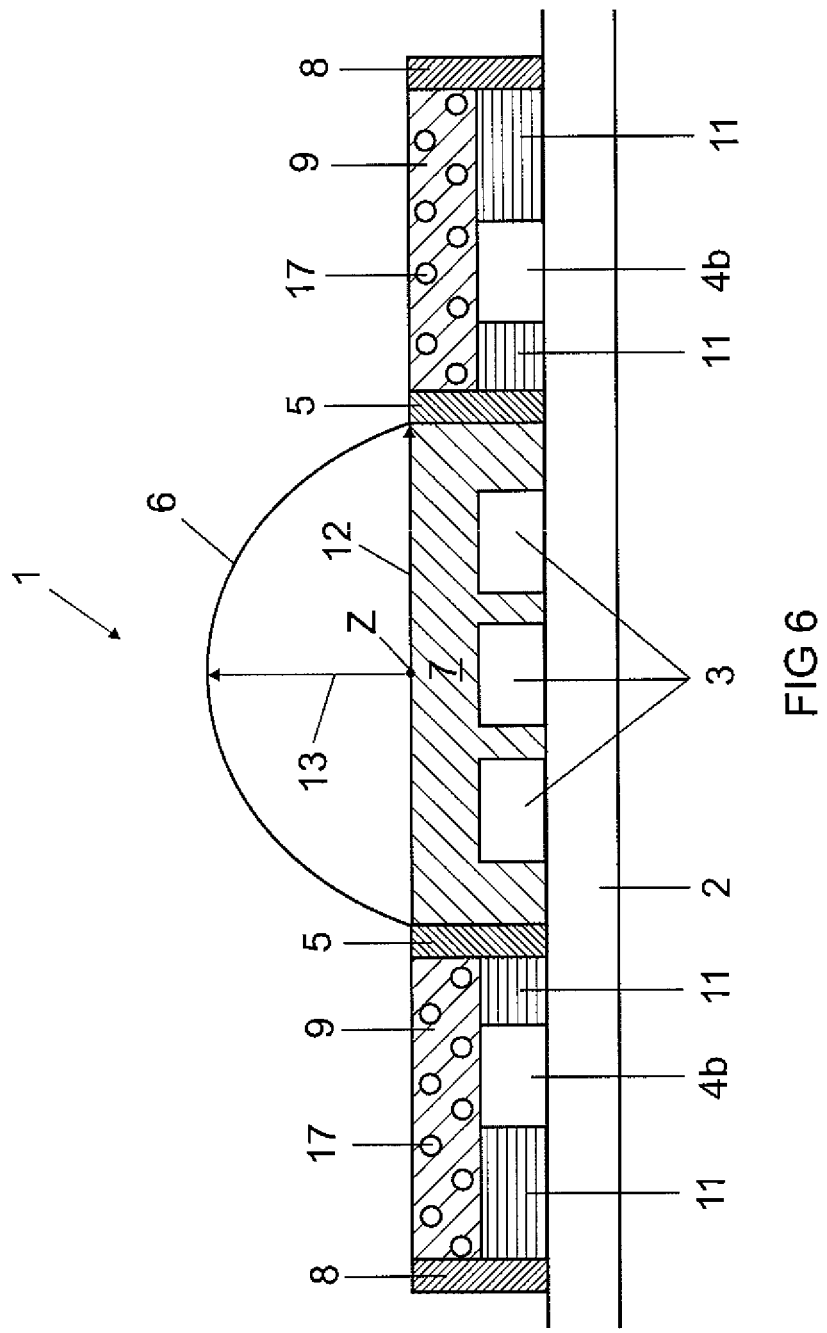

OPTOELECTRONIC COMPONENT AND METHOD FOR PRODUCING AN OPTOELECTRONIC COMPONENT

RELATED APPLICATIONS

This is a U.S. National Phase Application under 35 USC 371 of International Application PCT/EP2011/054106 filed on Mar. 18, 2011.

This application claims the priority of German application no. 10 2010 027 875.0 filed Apr. 16, 2010, the entire content of which is hereby incorporated by reference.

FIELD OF THE INVENTION

The present invention relates to an optoelectronic component for mixing electromagnetic radiation of different wavelengths. A method for producing an optoelectronic component is also proposed.

BACKGROUND OF THE INVENTION

To produce mixed light, semiconductor chips which emit electromagnetic radiation of different wavelengths can be combined directly adjacent to one another in an optoelectronic component. In this situation, one semiconductor chip may partially absorb the electromagnetic radiation of another semiconductor chip, which impairs the light output of the optoelectronic component.

For example, to produce warm white light, blue emitting InGaN semiconductor chips can be combined with red emitting AlGaInP semiconductor chips. High absorption losses may occur here, as the AlGaInP semiconductor chips are strongly absorbent of the electromagnetic radiation with wavelengths below about 600 nm emitted by the InGaN semiconductor chips, i.e. particularly in the blue region of the spectrum.

SUMMARY OF THE INVENTION

One object of the invention is to provide an optoelectronic component that minimizes the absorption losses.

Various embodiments have an optoelectronic component for mixing electromagnetic radiation of different wavelengths, particularly in the far field. On a carrier there is provided at least one first semiconductor chip for emitting electromagnetic radiation in a first spectral range. Also provided on the carrier is at least one second semiconductor chip for emitting electromagnetic radiation in a second spectral range. The first and second spectral ranges are different from one another. The at least one first semiconductor chip and the at least one second semiconductor chip are disposed in a single package. The at least one first semiconductor chip is optically isolated from the at least one second semiconductor chip by a barrier. In addition, the at least one first semiconductor chip and the at least one second semiconductor chip are each disposed centrosymmetrically about a common center of symmetry.

The barrier prevents the electromagnetic radiation emitted by the second semiconductor chips from being absorbed by the first semiconductor chips. Centrosymmetric means that the first semiconductor chips and the second semiconductor chips are each disposed about a common center of symmetry. In other words, the optoelectronic component has a common center of gravity for the first and the second semiconductor chips. Consequently, the mixed light emanating from the optoelectronic component exhibits a very good mix of the electromagnetic radiations from the first and the second spectral range. The mix is good particularly in the far field.

In a preferred embodiment, the first semiconductor chips can be disposed in an inner region of the optoelectronic component. The second semiconductor chips can be disposed in an outer region. In particular, the second semiconductor chips can be disposed in a ring pattern around the first semiconductor chips. This is advantageous, as it ensures a uniform luminance, particularly in the far field.

In a preferred embodiment, an additional barrier is disposed around the second semiconductor chips. This is advantageous, as it enables unwanted discharge of encapsulating material to the outside to be prevented.

In a preferred embodiment, the barrier between the first and the second semiconductor chips is ring-shaped. This is advantageous, as it ensures mixing of the electromagnetic radiation not just in the far field but even after a few centimeters. This can take place, for example, on a matt surface.

The additional barrier can also be ring-shaped.

In a preferred embodiment, the barriers can have a height of between about 200 µm and about 2 mm, preferably a height of about 500 µm. This is advantageous, as it prevents electromagnetic radiation of the second semiconductor chips from being absorbed by the first semiconductor chips.

The semiconductor chips have at least one active zone which emits electromagnetic radiation. The active zones can be pn-junctions, double heterostructure, multiple quantum well structure (MQW), single quantum well structure (SQW). Quantum well structure means: quantum wells (3-dim), quantum wires (2-dim) and quantum dots (1-dim).

In a preferred embodiment, the first semiconductor chip can be an AlGaInP semiconductor chip which is designed to emit electromagnetic radiation particularly in the red region of the spectrum.

The second semiconductor chip can be grown on a III-V compound semiconductor material, in particular a nitride compound semiconductor material such as gallium nitride (GaN). The second semiconductor chip can be, for example, an InGaN semiconductor chip which is designed to emit electromagnetic radiation particularly in the blue region of the spectrum.

In a preferred embodiment, some of the electromagnetic radiation from the blue spectral range emitted by the InGaN semiconductor chips can be converted into the yellow-green spectral range by a conversion means. The conversion means can have luminescent particles. The luminescent particles can contain phosphors. The phosphors can contain yttrium aluminum garnet. The partial conversion of blue light into yellow light is particularly advantageous, as white light can be produced by superimposing blue and yellow light.

Disposing the AlGaInP semiconductor chips and the InGaN semiconductor chips in one package is particularly advantageous, as it ensures good mixing of the electromagnetic radiation in the red spectral range with the blue and yellow-green radiation coming from the InGaN semiconductor chips. This mix of blue, yellow and red light is particularly suitable for producing warm white light. Due to the centrosymmetrical arrangement of the AlGaInP and InGaN semiconductor chips, it can also be ensured that the warm white light has high color homogeneity at least in the far field. As the AlGaInP semiconductor chips are strongly absorbent of electromagnetic radiation with wavelengths below about 600 nm, it is particularly advantageous for the AlGaInP and InGaN semiconductor chips to be separated by an optical barrier.

The semiconductor chips can be encapsulated. An encapsulating material serves to protect the contact wires, but above all to increase the efficiency of the coupling-out of electromagnetic radiation. With encapsulating material, the efficiency can be increased by up to 80% compared to the efficiency without encapsulating material.

The AlGaInP semiconductor chips in the center are encapsulated in a first encapsulating material. Silicone or epoxy resin can be used as encapsulants. The barrier around the AlGaInP semiconductor chips also serves as a flow-stop for the first encapsulating material. The first encapsulating material contains as few scattering centers as possible. The red light should leave the first encapsulating material as completely as possible without wavelength conversion. In particular, the first encapsulating material contains no phosphor.

In a preferred embodiment, the InGaN semiconductor chips are encapsulated in a second encapsulating material, in particular of silicone, in the form of a planar volume encapsulation. The second encapsulating material contains a conversion means, in particular a phosphor. Some of the electromagnetic radiation from the blue region of the spectrum emitted by the InGaN semiconductor chips is converted by the conversion means into electromagnetic radiation in the yellow-green spectral range.

In a preferred embodiment, a hemispherical coupling-out lens spans the AlGaInP semiconductor chips. In other words, the coupling-out lens covers the area enclosed by the barrier around the AlGaInP semiconductor chips, i.e. the inner region or more specifically the emitting area. The coupling-out lens is advantageous, as it increases the coupling-out efficiency for the electromagnetic radiation by reducing the amount of totally reflected radiation compared to an arrangement without lens.

In a preferred embodiment, the geometry of the coupling-out lens fulfills the so-called Weierstrass condition. This condition requires that the ratio of the radius of the circular area on which the AlGaInP semiconductor chips are disposed to the radius of the coupling-out lens corresponds to the ratio of the refractive index outside the coupling-out lens to the refractive index inside the coupling-out lens. This condition can be formulated thus:

$$\text{radius}_{area}/\text{radius}_{lens} \leq \text{refractive index}_{outside}/\text{refractive index}_{lens}$$

The refractive index of air, i.e. 1, is taken as the refractive index outside the coupling-out lens. The coupling-out lens can consist of high refractive index glass having a refractive index of 1.5. This results in the following condition:

$$\text{radius}_{area}/\text{radius}_{lens} \leq 1/1.5 = 2/3.$$

If the coupling-out lens consists of conventional silicone, the refractive index is 1.4. If the coupling-out lens consists of high refractive index silicone, the refractive index is 1.54.

Other encapsulating materials can also be used for the coupling-out lens.

For simplicity's sake, the value of 1.5 can be taken as the refractive index for the above encapsulating materials.

If the Weierstrass condition is fulfilled, the total internal reflection taking place at the transition from coupling-out lens to air is minimized. This is particularly advantageous, as it reduces the coupling-out losses.

In order to fulfill the Weierstrass condition, the AlGaInP semiconductor chips cannot be disposed in arbitrary proximity to the barrier, but must be disposed as centrally as possible.

The coupling-out lens can preferably be adhesively attached or produced by the encapsulating process itself.

If the Weierstrass condition is fulfilled, a Lambertian far field is produced for the electromagnetic radiation emitted by the AlGaInP semiconductor chips.

In a preferred embodiment, the InGaN semiconductor chips are formed as volume emitters, in particular as sapphire chips.

In another preferred embodiment, the InGaN semiconductor chips are implemented as surface emitters, in particular as thin film chips. The surface emitters are at least partially disposed in a highly reflective material, in particular a $TiO_2$ filled silicone. Alternatively, the silicone can also be filled with $ZrO_2$, $Al_2O_3$ or ZnO. The InGaN semiconductor chips are embedded in the white silicone up to the epitaxial height. This is particularly advantageous, as it enables up to 95% reflectivity to be achieved. By comparison, the carrier is highly absorbent and the InGaN semiconductor chip itself has a reflectivity of only about 85%.

Planar conversion encapsulation with the second encapsulating material takes place onto the layer of $TiO_2$ filled silicone. Such planar conversion encapsulations provide a Lambertian radiation profile of the emitted electromagnetic radiation.

In a preferred embodiment, the barriers are highly reflective. A reflectivity of greater than 90%, preferably of greater than 95%, is achievable. $TiO_2$, $ZrO_2$, $Al_2O_3$ or ZnO filled PBT (polybutylene terephthalate) can be used as the barrier material. The high reflectivity of the barrier is particularly advantageous, as it minimizes the absorption losses in the barriers.

Different embodiments have a method for producing an optoelectronic component for mixing electromagnetic radiation of different wavelengths, particularly in the far field. This involves the following steps: first, at least one first semiconductor chip and at least one second semiconductor chip are disposed on a carrier. The at least one first semiconductor chip and the at least one second semiconductor chip are disposed in a package. The at least one first semiconductor chip and the at least one second semiconductor chip are disposed centrosymmetrically with respect to a common center of symmetry. A barrier is then disposed between the at least one first semiconductor chip and the at least one second semiconductor chip.

Alternatively, the barrier can already be present prior to the disposing of the semiconductor chips. In particular, premold packages can be used for this purpose.

The barrier serves to provide complete optical isolation of the inner region containing the first semiconductor chips from the outer region containing the second semiconductor chips.

BRIEF DESCRIPTION OF THE DRAWINGS

Various exemplary embodiments of the inventive solution will now be explained in greater detail with reference to the accompanying drawings.

FIG. 1b shows a sectional view of the optoelectronic component from FIG. 1a;
FIG. 1c shows a sectional view of the optoelectronic component from FIG. 1a;
FIG. 1d shows a sectional view of the optoelectronic component from FIG. 1a;
FIG. 4b shows a sectional view of the optoelectronic component from FIG. 4a.

FIG. 5b shows a sectional view of the optoelectronic component from FIG. 5a;

FIG. 6 shows a sectional view of an optoelectronic component;

DETAILED DESCRIPTION OF THE DRAWINGS

Figure 1A:
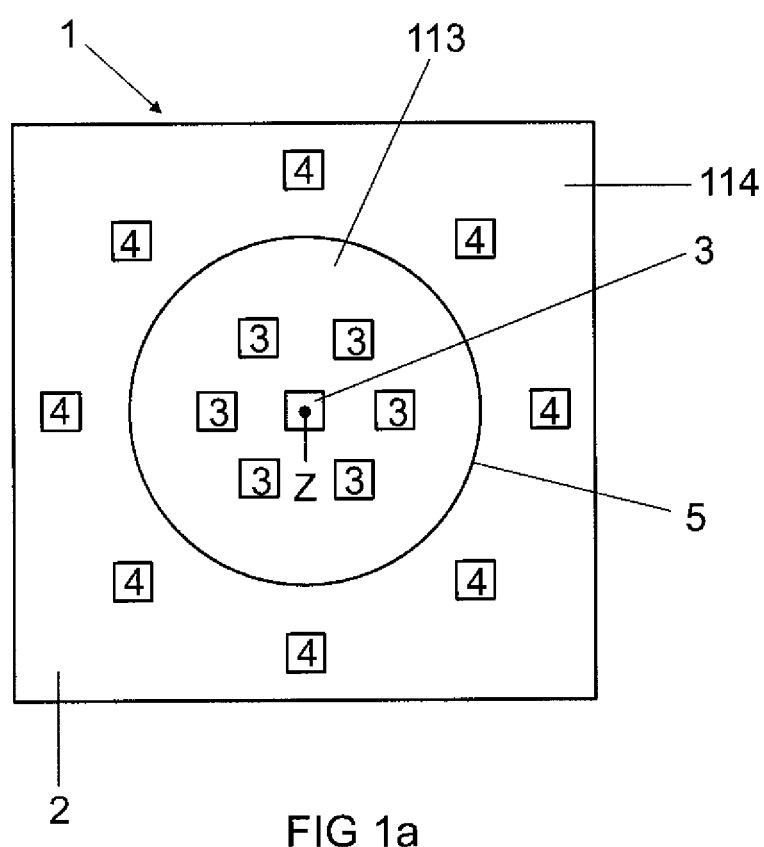
FIG. 1a shows a plan view of an optoelectronic component.

Elements that are identical, similar or produce an identical effect are provided with the same reference characters in the figures. The figures and the relative sizes of the elements represented in the figures are not to be considered as being to scale. Rather, individual elements may be shown exaggeratedly large for the sake of clarity and better understanding.

FIG. 1a shows a plan view of an optoelectronic component 1. The optoelectronic component 1 is used for mixing electromagnetic radiation having different wavelengths, particularly in the far field. First semiconductor chips 3 for emitting electromagnetic radiation in a first spectral range are provided on a carrier 2. Second semiconductor chips 4 for emitting electromagnetic radiation in a second spectral range are likewise provided on the carrier 2. The first semiconductor chips 3 and the second semiconductor chips 4 are disposed in a single package. The first semiconductor chips 3 are optically isolated from the second semiconductor chips 4 by a barrier 5. A plurality of first semiconductor chips 3 and a plurality of second semiconductor chips 4 are provided. The first semiconductor chips 3 and the second semiconductor chips 4 are in each case disposed centrosymmetrically about a common center of symmetry Z.

The first semiconductor chips 3 are disposed in the inner region 113, in the center of the optoelectronic component 1. The second semiconductor chips 4 are disposed in an outer region 114, in a ring pattern around the first semiconductor chips 3.

The barrier 5 between the first semiconductor chips 3 and the second semiconductor chips 4 is ring-shaped. The barrier 5 has a high reflectivity of more than 90%, preferably of more than 95%.

The first semiconductor chips 3 can be implemented as AlGaInP semiconductor chips. AlGaInP semiconductor chips emit electromagnetic radiation preferably from the red region of the spectrum.

The second semiconductor chips 4 can be implemented as InGaN semiconductor chips. InGaN semiconductor chips preferably emit electromagnetic radiation from the UV to the green region of the spectrum, with particular preference from the blue region of the spectrum.

Figure 1B:
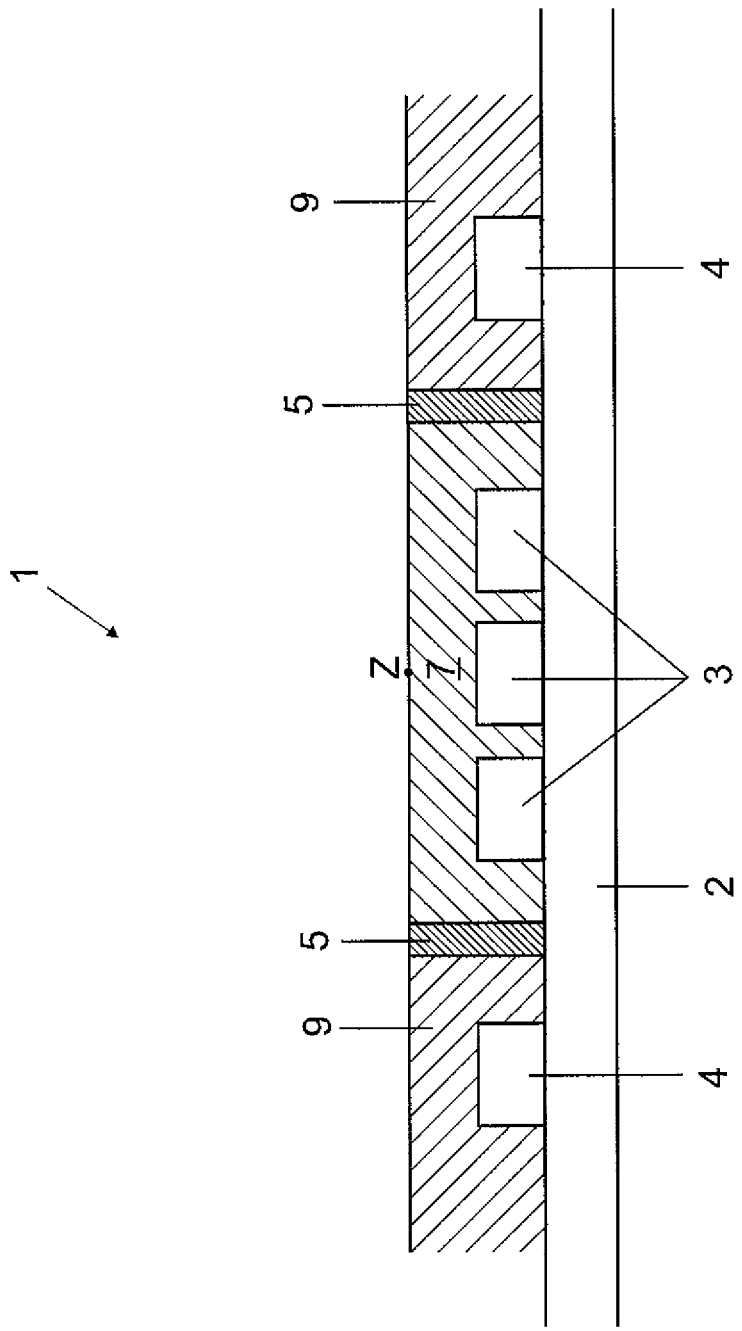

FIG. 1b shows a sectional view of the optoelectronic component from FIG. 1a. The highly reflective barrier 5 has a height of between about 200 μm and about 2 mm, preferably a height of about 500 μm. As in FIG. 1a, the AlGaInP semiconductor chips 3 and the InGaN semiconductor chips 4 are disposed centrosymmetrically about the common center of symmetry Z. The AlGaInP semiconductor chips 3 are encapsulated in a first encapsulating material 7. The encapsulating material 7 can comprise silicone or epoxy resin. The InGaN semiconductor chips 4 are encapsulated in a second encapsulating material 9, in particular of silicone. The second encapsulating material 9 has the shape of a planar volume encapsulation that is flush with the barrier 5.

FIG. 1c shows another sectional view of the optoelectronic component from FIG. 1a. FIG. 1c differs from FIG. 1b only in that, in the region of the AlGaInP semiconductor chips 3, the carrier 2 is lined with a third encapsulating material 18 between the AlGaInP semiconductor chips 3. A white $TiO_2$ filled compound can be used as the third encapsulating material 18. The third encapsulating material 18 ensures that red scattered light is efficiently reflected.

FIG. 1d shows another sectional view of the optoelectronic component from FIG. 1a. FIG. 1d shows InGaN semiconductor chips 4b which are implemented as surface emitters, in particular as thin film chips. FIG. 1d differs from FIG. 1b only in that the InGaN semiconductor chips 4b are embedded in a highly reflective material 11, in particular a $TiO_2$ filled silicone. As an alternative to a $TiO_2$ filler, the silicone can also be filled with $ZrO_2$, $Al_2O_3$ or ZnO. The highly reflective material 11 can be flush with the surface emitters 4b. A second encapsulating material 9 is applied to the surface emitters 4b and the highly reflective material 11.

Figure 2A:
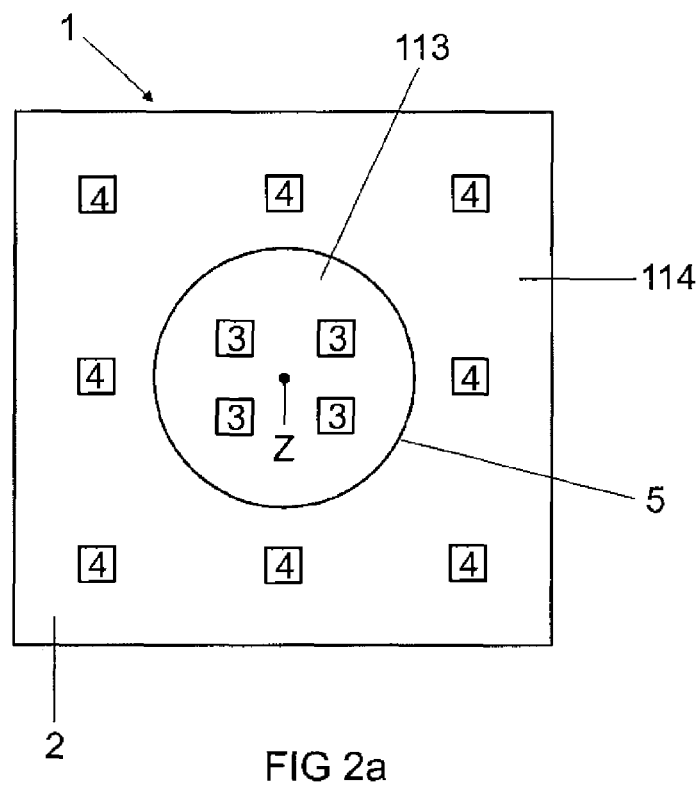
FIG. 2a shows a plan view of an optoelectronic component.

FIG. 2a shows a plan view of another optoelectronic component. The AlGaInP semiconductor chips 3 are disposed in the inner region 113 in a square pattern around the center Z. The AlGaInP semiconductor chips 3 are enclosed by the barrier 5. The InGaN semiconductor chips 4 are disposed in the outer region 114 in a square pattern around the AlGaInP semiconductor chips 3. The arrangement of the InGaN semiconductor chips is also symmetrical about the center Z.

Figure 2B:
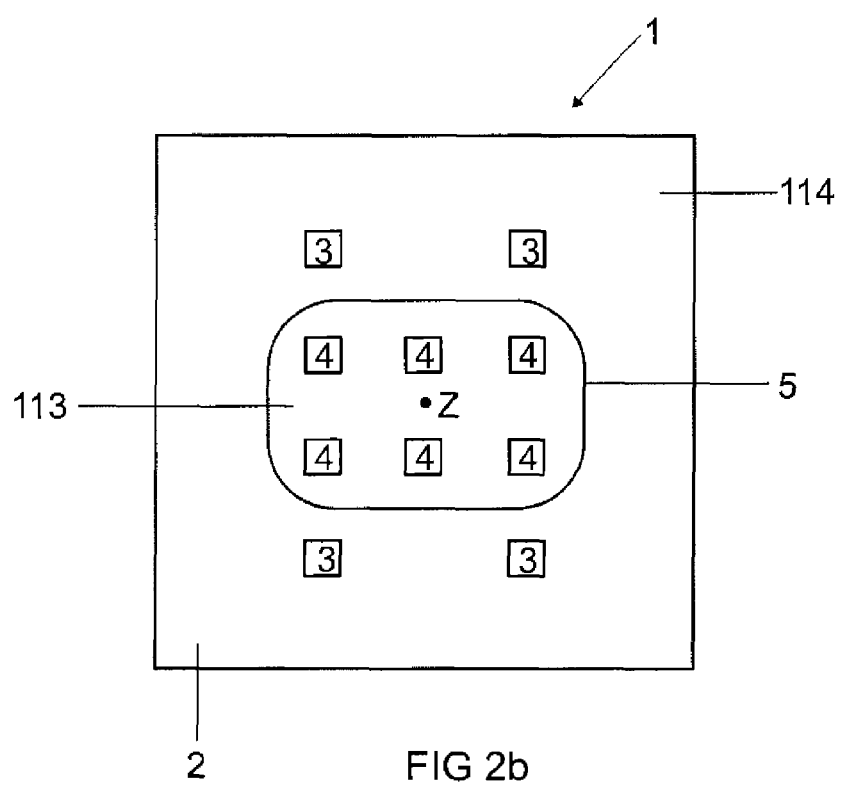
FIG. 2b shows a plan view of an optoelectronic component.

FIG. 2b shows a plan view of another optoelectronic component 1. InGaN semiconductor chips 4 are disposed in a rectangular manner inside the barrier 5. AlGaInP semiconductor chips 3 are disposed outside the barrier 5. The center Z is again the common center of symmetry for the InGaN semiconductor chips 4 and the AlGaInP semiconductor chips 3.

Figure 3:
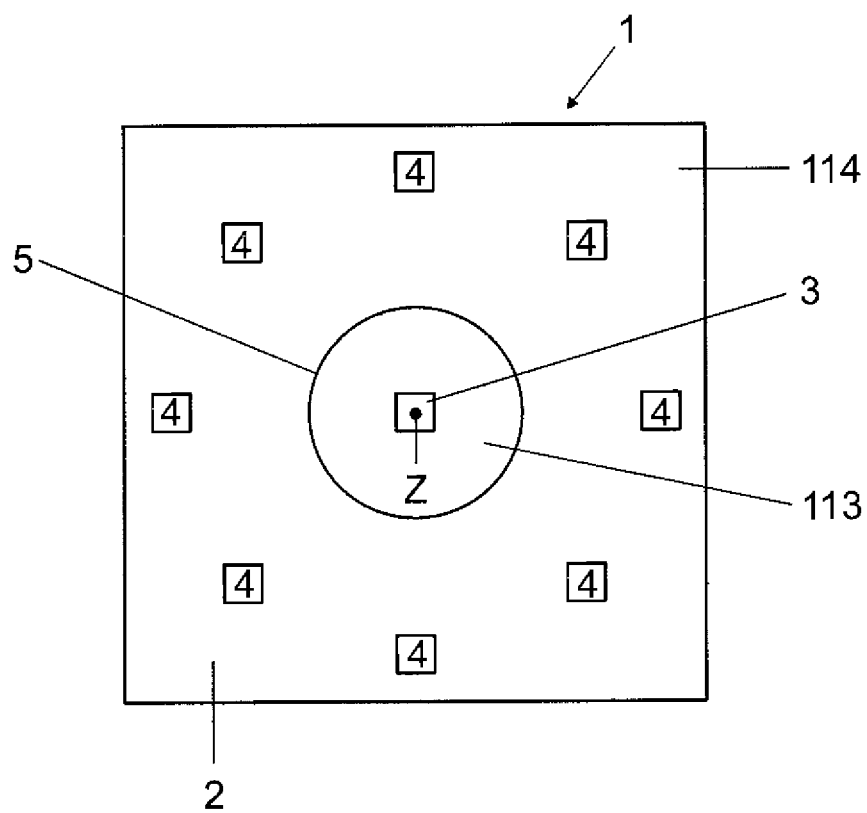
FIG. 3 shows a plan view of an optoelectronic component.

FIG. 3 shows a plan view of another optoelectronic component 1. Disposed in the center of the optoelectronic component 1 is a single AlGaInP semiconductor chip 3 which is laterally enclosed by the highly reflective barrier 5. In the outer region 114, a plurality of InGaN semiconductor chips are disposed in a ring pattern around the center Z.

Figure 4A:
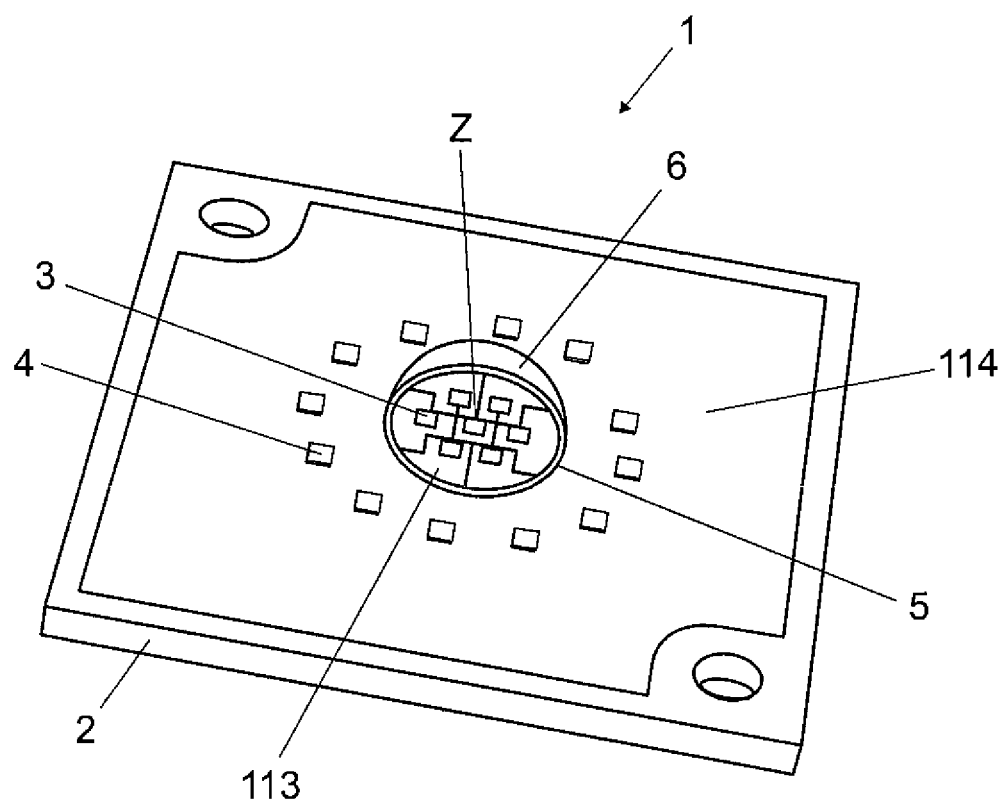
FIG. 4a shows a 3-dimensional view of an optoelectronic component.

FIG. 4a shows a 3-dimensional view of an optoelectronic component. A hemispherical coupling-out lens 6 whose geometry satisfies the Weierstrass condition spans the AlGaInP semiconductor chips 3. The InGaN semiconductor chips 4 spaced at regular intervals encircle the AlGaInP semiconductor chips 3. The barrier 5 isolates the inner region 113 containing the AlGaInP semiconductor chips 3 from the outer region 114 containing the InGaN semiconductor chips 4. The center Z is again the common center of symmetry for the InGaN semiconductor chips 4 and the AlGaInP semiconductor chips 3.

Figure 4B:
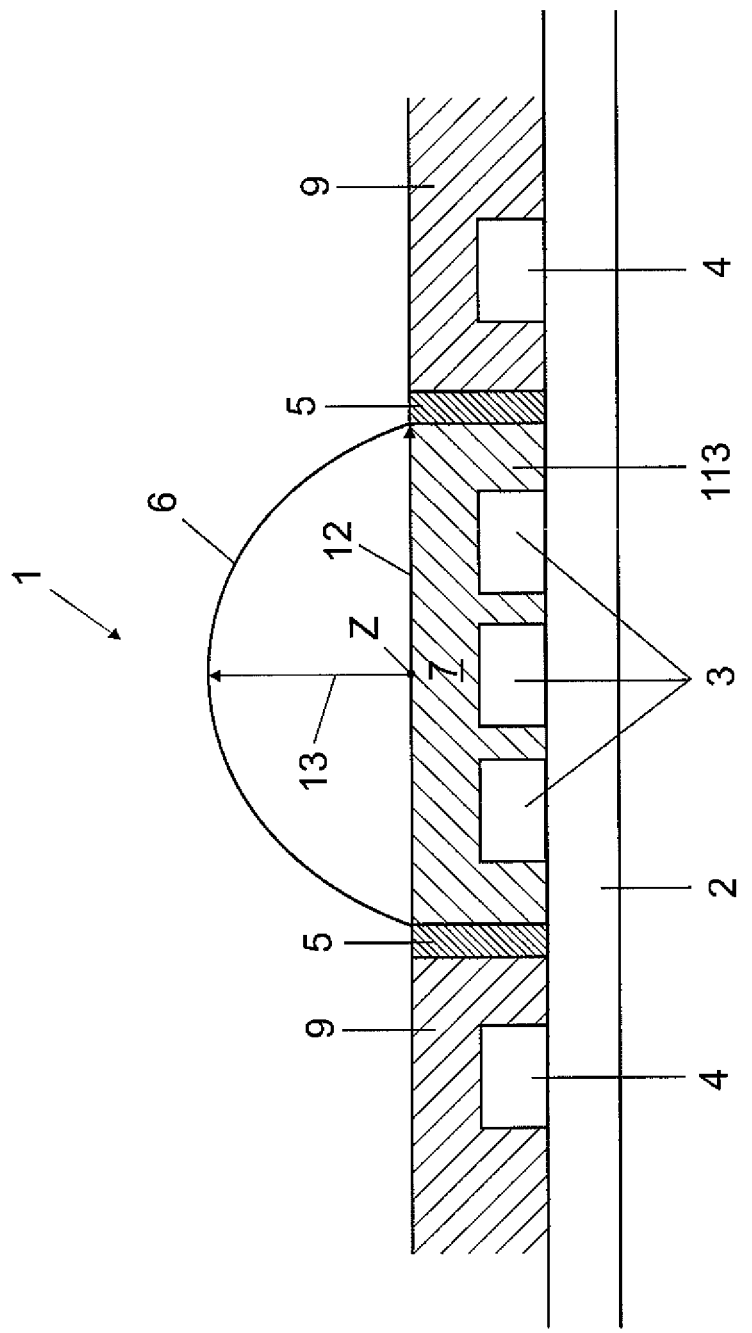

FIG. 4b shows a sectional view of the optoelectronic component from FIG. 4a. The exemplary embodiment in FIG. 4b corresponds to the exemplary embodiment in FIG. 1b except that a coupling-out lens 6 is disposed above the inner region 113 in which the AlGaInP semiconductor chips 3 are disposed. The coupling-out lens 6 satisfies the Weierstrass condition.

This means that the radius 13 of the coupling-out lens 6 and the radius 12 of the emitting area are related as follows:

$$\text{radius}_{area}/\text{radius}_{lens} \le \text{refractive index}_{outside}/\text{refractive index}_{lens}$$

The refractive index outside is 1. The refractive index of the lens is assumed to be 1.5.

Figure 5A:
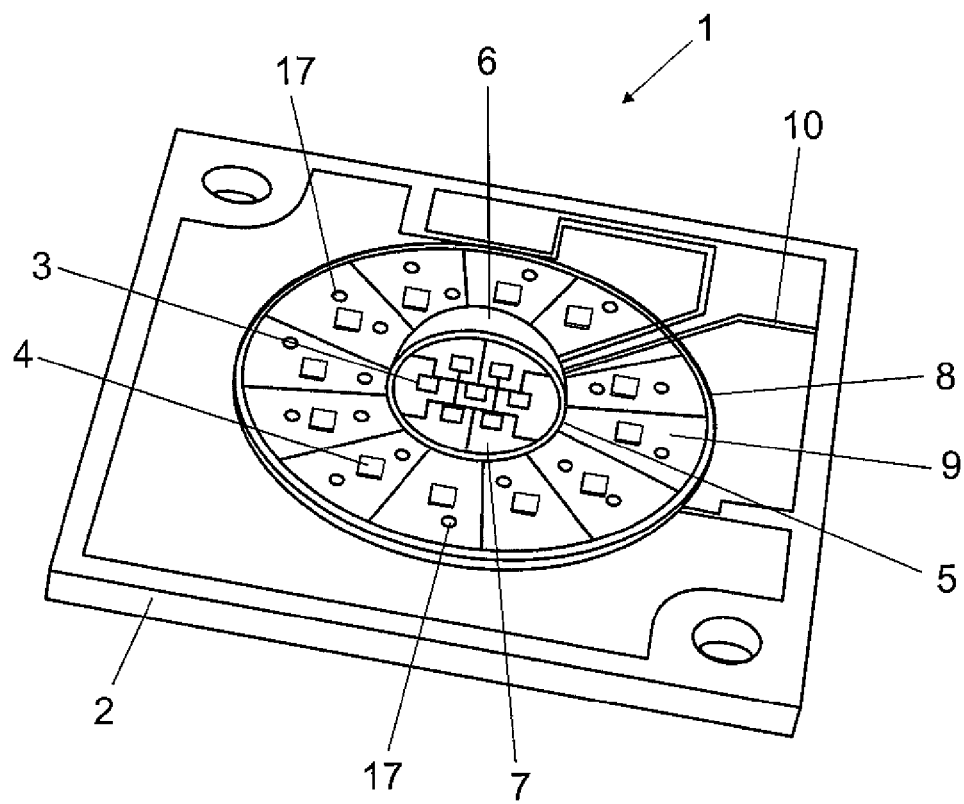
FIG. 5a shows a 3-dimensional view of an optoelectronic component.

FIG. 5a shows a 3-dimensional view of an optoelectronic component. As an addition to the exemplary embodiment shown in FIG. 4a, the InGaN semiconductor chips 4 disposed in a circular pattern about the center of symmetry Z are enclosed by an additional ring-shaped barrier 8. The additional barrier 8 has a reflectivity greater than 90%, preferably greater than 95%. The InGaN semiconductor chips 4 are encapsulated in a second encapsulating material 9. The second encapsulating material 9 has a conversion means 17, in particular a phosphor. Some of the electromagnetic radiation from the blue region of the spectrum emitted by the InGaN semiconductor chips 4 is converted by the conversion means 17 into the yellow-green spectral range. The semiconductor chips 3, 4 are connected to power sources (not shown) via electrical interconnects and traces 10.

Figure 5B:
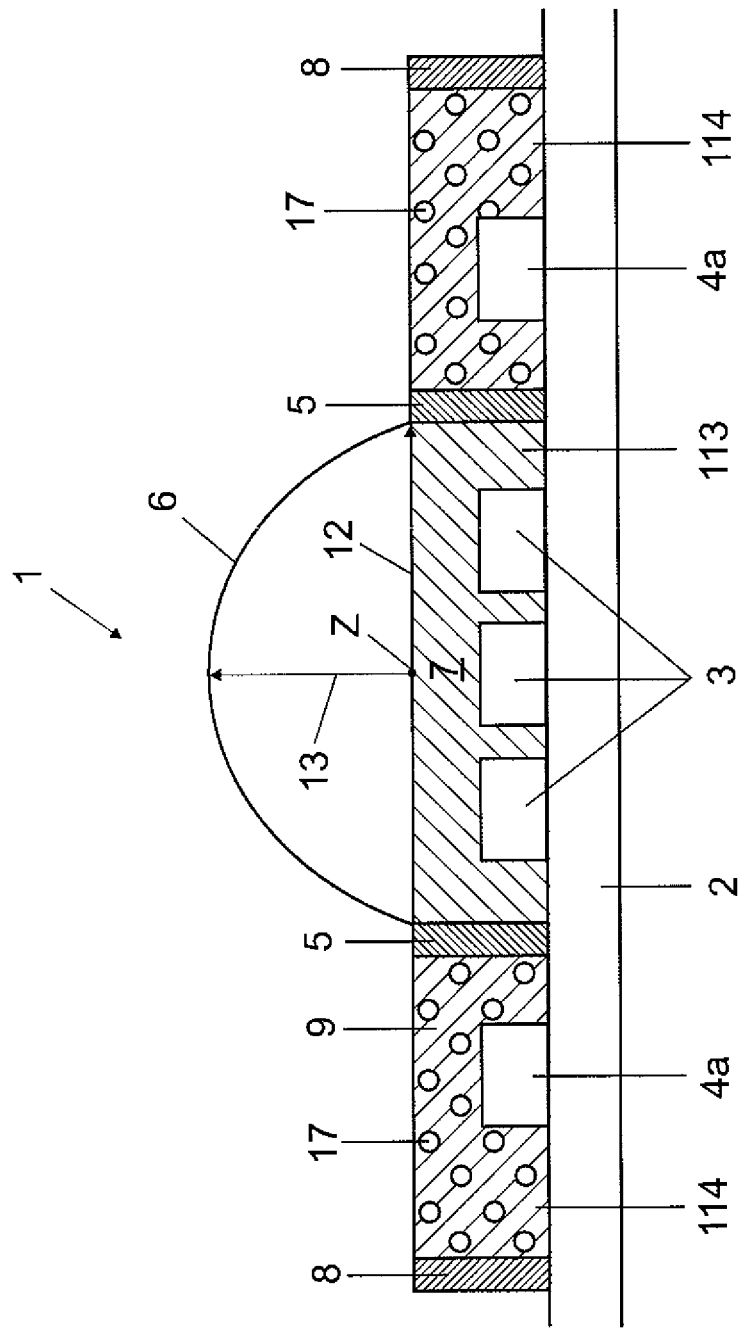

FIG. 5b shows a sectional view of the optoelectronic component from FIG. 5a. InGaN semiconductor chips 4a as volume emitters, in particular as sapphire chips, are completely encapsulated in the second encapsulating material 9. A conversion means 17 in the form of luminescent particles is incorporated in the encapsulation. The luminescent particles can comprise phosphors. As in the exemplary embodiment in FIG. 4b, a coupling-out lens 6 completely covers the inner region 113. The outer region 114 is enclosed by another highly reflective barrier 8. The additional barrier 8 has a reflectivity greater than 90%, preferably greater than FIG. 6 shows a sectional view of an optoelectronic component. The InGaN semiconductor chips 4b are designed as surface emitters, in particular as thin film chips. The InGaN semiconductor chips 4b are laterally encapsulated in a highly reflective material 11, in particular white silicone. The second encapsulating material 9 is applied to said highly reflective material 11. The second encapsulating material 9 comprises the conversion means 17. FIG. 6 and FIG. 5b are otherwise identical.

Figure 7:
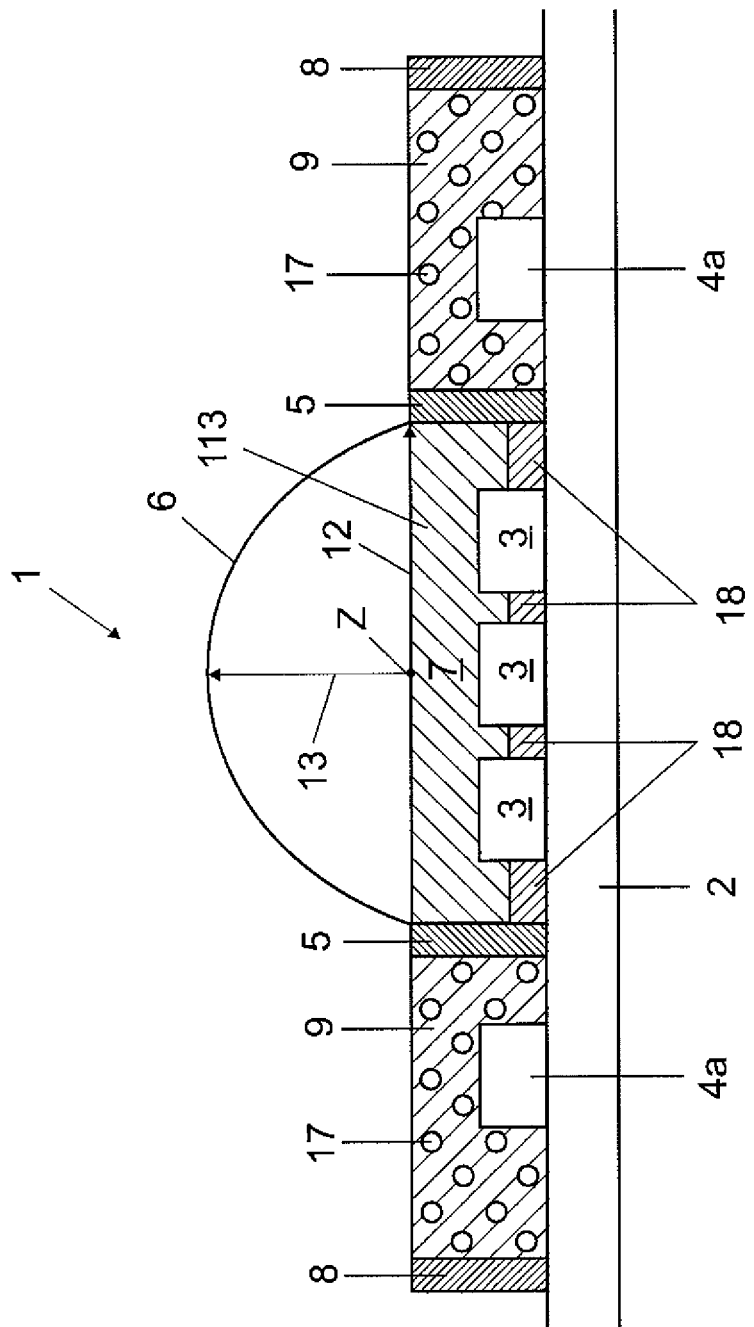
FIG. 7 shows a sectional view of an optoelectronic component.

FIG. 7 shows a sectional view of an optoelectronic component 1. The AlGaInP semiconductor chips 3 in the inner region 113 of the optoelectronic component 1 are laterally encapsulated in a third encapsulating material 18. The third encapsulating material 18 can be filled with $TiO_2$ particles. The third encapsulating material 18 ensures that scattered light coupled into the coupling-out lens 6 from the region of the InGaN semiconductor chips 4 via the region of the AlGaInP semiconductor chips 3 is efficiently reflected. The scattered light is preferably white mixed light. The first encapsulating material 7 is applied to the third encapsulating material 18.

Figure 8:
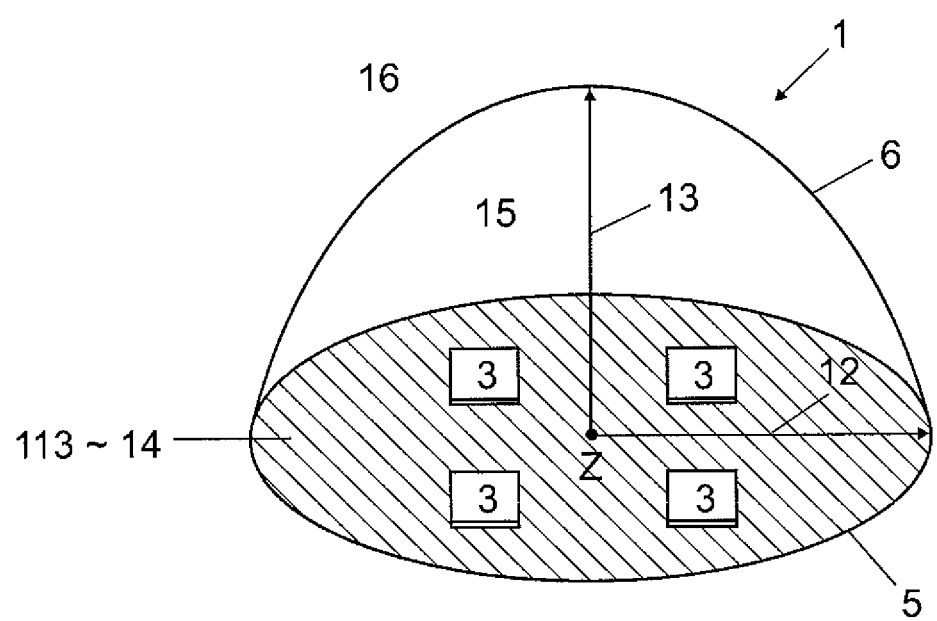
FIG. 8 shows a detail of a 3-dimensional view of an optoelectronic component.

FIG. 8 shows a detail from FIG. 5a, namely the inner region 113 of the optoelectronic component 1 which is enclosed by the barrier 5. The inner region 113 constitutes a circular emitting area 14. This emitting area 14 has a particular radius 12. The hemispherical lens 6 extends over the emitting area 14. The hemispherical lens 6 has a particular radius 13. The lens 6 has a refractive index 15 of about 1.5. Outside the lens 6, the refractive index of air is assumed, namely 1. The two radii 12 and 13 are selected such that the Weierstrass condition is satisfied.

To illustrate the underlying concept, the optoelectronic component has been described with reference to a number of exemplary embodiments. These exemplary embodiments are not limited to particular combinations of features. Even though some features and implementations have only been described in connection with a particular exemplary embodiment or individual exemplary embodiments, they can in each case be combined with other features from other exemplary embodiments. It is likewise conceivable to omit or add individual described features or particular implementations in exemplary embodiments, provided that the general technical teaching remains realized.

The invention claimed is:

1. An optoelectronic component for mixing electromagnetic radiation having different wavelengths, particularly in the far field, comprising:
a carrier;
at least one first semiconductor chip provided on the carrier for emitting electromagnetic radiation in a first spectral range; and
at least one second semiconductor chip provided on the carrier for emitting electromagnetic radiation in a second spectral range,
wherein the optoelectronic component comprises volume emitters and surface emitters,
wherein the first semiconductor chip is an AlGaInP semiconductor chip for emitting electromagnetic radiation in a red region of the spectrum,
wherein the first and the second spectral ranges are different from one another,
wherein the first semiconductor chip and the second semiconductor chip are disposed in a single package,
wherein the first semiconductor chip is optically isolated from the second semiconductor chip by a barrier, and
wherein the first semiconductor chip and the second semiconductor chip are in each case disposed centrosymmetrically about a common center of symmetry.

2. The optoelectronic component as claimed in claim 1, wherein the at least one first semiconductor chip is disposed in an inner region and the at least one second semiconductor chip in an outer region on the carrier.

3. The optoelectronic component as claimed in claim 1, wherein an additional barrier is disposed around the second semiconductor chips.

4. The optoelectronic component as claimed in claim 3, wherein the barrier and/or the additional barrier is/are ring-shaped.

5. The optoelectronic component as claimed in claim 1, wherein the second semiconductor chip is an InGaN semiconductor chip for emitting electromagnetic radiation in a blue region of the spectrum.

6. The optoelectronic component as claimed in claim 5, wherein some of the electromagnetic radiation emitted by the InGaN semiconductor chip is converted by a conversion means, in particular into a yellow-green spectral range.

7. The optoelectronic component as claimed in claim 1, wherein the AlGaInP semiconductor chips are encapsulated in a first encapsulating material, in particular silicone or epoxy resin.

8. The optoelectronic component as claimed in claim 5, wherein the InGaN semiconductor chips are encapsulated in a second encapsulating in a form of a planar volume encapsulation, wherein the second encapsulating material has a conversion means.

9. The optoelectronic component as claimed in claim 1, wherein a hemispherical coupling-out lens, whose geometry satisfies a Weierstrass condition, spans the first semiconductor chips.

10. The optoelectronic component as claimed in claim 5, wherein the InGaN semiconductor chips are implemented as the volume emitters and/or as the surface emitters.

11. The optoelectronic component as claimed in claim 10, wherein the surface emitters are at least partially disposed in a highly reflective material, in particular a $TiO_2$, $ZrO_2$, $Al_2O_3$ or ZnO filled silicone.

12. The optoelectronic component as claimed in claim 1, wherein the barrier and/or the additional barrier is/are highly reflective, having a reflectivity greater than 90%, preferably greater than 95%.

13. An optoelectronic component for mixing electromagnetic radiation having different wavelengths, particularly in the far field, comprising:
a carrier;

at least one first semiconductor chip provided on the carrier for emitting electromagnetic radiation in a first spectral range, wherein the first semiconductor chip is an AlGaInP semiconductor chip for emitting electromagnetic radiation in a red region of the spectrum; and at least one second semiconductor chip provided on the carrier for emitting electromagnetic radiation in a second spectral range, wherein the second semiconductor chip is an InGaN semiconductor chip for emitting electromagnetic radiation in a blue region of the spectrum and wherein the optoelectronic component comprises volume emitters and surface emitters;

wherein the first semiconductor chip and the second semiconductor chip are disposed in a single package, wherein the first semiconductor chip is optically isolated from the second semiconductor chip by a barrier, and wherein the first semiconductor chip and the second semiconductor chip are in each case disposed about a common center of gravity.

14. The optoelectronic component as claimed in claim 8, wherein the second encapsulating material is silicone.

15. The optoelectronic component as claimed in claim 10, wherein the volume emitters are sapphire chips, and/or as the surface emitters are thin film chips.

16. An optoelectronic component for mixing electromagnetic radiation having different wavelengths, particularly in the far field, comprising:

a carrier;

at least one first semiconductor chip provided on the carrier for emitting electromagnetic radiation in a first spectral range; and at least one second semiconductor chip provided on the carrier for emitting electromagnetic radiation in a second spectral range, wherein the optoelectronic component comprises volume emitters and surface emitters, wherein the second semiconductor chip is an InGaN semiconductor chip for emitting electromagnetic radiation in a blue region of the spectrum, wherein the first and the second spectral ranges are different from one another, wherein the first semiconductor chip and the second semiconductor chip are disposed in a single package, wherein the first semiconductor chip is optical/y isolated from the second semiconductor chip by a barrier, and wherein the first semiconductor chip and the second semiconductor chip are in each case disposed centrosymmetrically about a common center of symmetry.

* * * * *

UNITED STATES PATENT AND TRADEMARK OFFICE
CERTIFICATE OF CORRECTION

PATENT NO. : 8,835,931 B2
APPLICATION NO. : 13/641650
DATED : September 16, 2014
INVENTOR(S) : Ralf Wirth It is certified that error appears in the above-identified patent and that said Letters Patent is hereby corrected as shown below:

In the Claims

Column 8, claim 12, lines 60-63 should read:

12. The optoelectronic component as claimed in claim 3, wherein the barrier and/or the additional barrier is/are highly reflective, having a reflectivity greater than 90%, preferably greater than 95%.

Column 10, claim 16, lines 1-24 should read:

16. An optoelectronic component for mixing electromagnetic radiation having different wavelengths, particularly in the far field, comprising:

a carrier;

at least one first semiconductor chip provided on the carrier for emitting electromagnetic radiation in a first spectral range; and at least one second semiconductor chip provided on the carrier for emitting electromagnetic radiation in a second spectral range, wherein the optoelectronic component comprises volume emitters and surface emitters, wherein the second semiconductor chip is an InGaN semiconductor chip for emitting electromagnetic radiation in a blue region of the spectrum, wherein the first and the second spectral ranges are different from one another, wherein the first semiconductor chip and the second semiconductor chip are disposed in a single package, wherein the first semiconductor chip is optically isolated from the second semiconductor chip by a barrier, and Signed and Sealed this
Twelfth Day of May, 2015

Michelle K. Lee
*Director of the United States Patent and Trademark Office* wherein the first semiconductor chip and the second semiconductor chip are in each case disposed centrosymmetrically about a common center of symmetry.